(12) United States Patent
Ju

(10) Patent No.: US 9,397,021 B2
(45) Date of Patent: Jul. 19, 2016

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD., Keelung (TW)

( * ) Notice: Subject to any disclaimer, the term of this patent is extended or adjusted under 35 U.S.C. 154(b) by 148 days.

(21) Appl. No.: 14/538,352

(22) Filed: Nov. 11, 2014

(65) Prior Publication Data

US 2015/0146383 A1    May 28, 2015

(30) Foreign Application Priority Data

Nov. 26, 2013  (CN) ........................ 2013 2 0750668 U

(51) Int. Cl.
*H01L 23/32* (2006.01)
*H01L 23/498* (2006.01)
*H01L 23/00* (2006.01)

(52) U.S. Cl.
CPC .......... *H01L 23/32* (2013.01); *H01L 23/49811* (2013.01); *H01L 23/49827* (2013.01); *H01L 23/49866* (2013.01); *H01L 24/13* (2013.01); *H01L 24/72* (2013.01); *H01L 24/73* (2013.01); *H01L 24/91* (2013.01); *H01L 24/81* (2013.01); *H01L 24/90* (2013.01); *H01L 2224/1339* (2013.01); *H01L 2224/13076* (2013.01); *H01L 2224/13111* (2013.01); *H01L 2224/13205* (2013.01); *H01L 2224/13209* (2013.01); *H01L 2224/13339* (2013.01); *H01L 2224/13347* (2013.01); *H01L 2224/13409* (2013.01); *H01L 2224/13411* (2013.01); *H01L 2224/13418* (2013.01); *H01L 2224/16225* (2013.01); *H01L 2224/16227* (2013.01); *H01L 2224/16235* (2013.01); *H01L 2224/73251* (2013.01); *H01L 2224/8114* (2013.01); *H01L 2224/8169* (2013.01); *H01L 2224/81191* (2013.01); *H01L 2224/81192* (2013.01); *H01L 2224/81405* (2013.01); *H01L 2224/81409* (2013.01); *H01L 2224/81505* (2013.01); *H01L 2224/81509* (2013.01); *H01L 2224/81639* (2013.01); *H01L 2224/81647* (2013.01); *H01L 2224/81709* (2013.01); *H01L 2224/81711* (2013.01);

(Continued)

(58) Field of Classification Search
CPC .......................... H01L 23/32; H01L 23/49811
See application file for complete search history.

(56) References Cited

U.S. PATENT DOCUMENTS

| | | | | | |
|---|---|---|---|---|---|
| 5,518,410 | A | * | 5/1996 | Masami | H05K 7/1069 324/750.25 |
| 5,887,344 | A | * | 3/1999 | Sinclair | H01R 13/04 174/266 |
| 5,984,694 | A | * | 11/1999 | Sinclair | H01R 13/04 439/70 |

(Continued)

*Primary Examiner* — Adrian S Wilson
(74) *Attorney, Agent, or Firm* — Locke Lord LLP; Tim Tingkang Xia, Esq.

(57) ABSTRACT

An electrical connector for electrically connecting a chip module to a circuit board, includes an insulating body, multiple conducting bodies, and multiple pieces of low melting point metal. The insulating body has multiple accommodating spaces. Each accommodating space runs through upper and lower surfaces of the insulating body. The multiple conducting bodies are respectively received in the accommodating spaces. Two ends of each conducting body are exposed on the upper and lower surfaces of the insulating body. The low melting point metal is gallium or gallium alloy. Each piece of the low melting point metal is correspondingly arranged at at least one end of one of the conducting bodies. The low melting point metal protrudes from the insulating body, and is electrically connected to the chip module.

26 Claims, 13 Drawing Sheets

(52) U.S. Cl.
CPC ............... *H01L2224/81718* (2013.01); *H01L 2224/81901* (2013.01); *H01L 2924/3841* (2013.01)

(56) References Cited

U.S. PATENT DOCUMENTS

| | | | | |
|---|---|---|---|---|
| 6,193,524 B1 * | 2/2001 | Chang | ................ | H01R 13/2428 439/66 |
| 6,373,273 B2 * | 4/2002 | Akram | ........................ | 257/730 |
| 6,464,511 B1 * | 10/2002 | Watanabe | .......... | G01R 1/07371 439/66 |
| 6,574,114 B1 * | 6/2003 | Brindle | ............. | G02B 6/12007 174/262 |
| 6,974,332 B2 * | 12/2005 | Ma | .................... | H01R 13/2421 439/66 |
| 7,029,288 B2 * | 4/2006 | Li | ........................ | H01L 21/486 257/E23.067 |
| 7,147,478 B1 * | 12/2006 | Ju | ........................ | H01R 3/08 439/178 |
| 7,442,045 B1 * | 10/2008 | Di Stefano | ............. | H01R 4/027 439/439 |
| 7,458,818 B2 * | 12/2008 | Kiyofuji | ............ | G01R 1/07371 324/750.07 |
| 7,615,707 B2 * | 11/2009 | Lin | ...................... | H05K 3/0094 174/261 |
| 7,731,513 B1 * | 6/2010 | Lin | .................... | H01R 13/2421 439/179 |
| 7,837,476 B2 * | 11/2010 | Di Stefano | ............. | H01R 4/027 439/66 |
| 7,980,862 B2 * | 7/2011 | Di Stefano | ............. | H01R 4/027 439/66 |
| 9,136,630 B1 * | 9/2015 | Ju | ...................... | H01R 12/7082 |
| 9,211,612 B2 * | 12/2015 | Ju | ...................... | B23K 35/00 |
| 9,326,387 B2 * | 4/2016 | Ju | ........................ | H05K 3/32 |
| 2007/0128906 A1 * | 6/2007 | Kazama | ............ | G01R 1/06722 439/179 |
| 2007/0232103 A1 * | 10/2007 | Matsuo | .............. | H01R 13/2414 439/179 |
| 2015/0163897 A1 * | 6/2015 | Ju | ........................ | H01R 13/035 361/783 |
| 2015/0244095 A1 * | 8/2015 | Ju | ...................... | H01R 12/7076 439/66 |
| 2015/0245489 A1 * | 8/2015 | Ju | ........................ | H05K 3/3436 361/760 |

* cited by examiner

ELECTRICAL CONNECTOR

CROSS-REFERENCE TO RELATED APPLICATION

This non-provisional application claims priority under 35 U.S.C. §119(a) on Patent Application No. 201320750668.9 filed in P.R. China on Nov. 26, 2013, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to an electrical connector, and more particularly to an electrical connector for electrically connecting a chip module to a circuit board.

BACKGROUND OF THE INVENTION

A conventional electrical connector is used for connecting a chip module to a circuit board. The electrical connector includes an insulating body. Multiple accommodating holes are arranged in the insulating body. Each accommodating hole is internally provided with a terminal. The terminal is stamped, folded and molded using a metal material. One end of the terminal is mated with the chip module, and the other end thereof is mated with the circuit board. Because of limitation of conditions such as stamping and folding, the terminal cannot be made very small, so that the volume of the electrical connector is large, which is not applicable to the development trend of miniaturization and compactness.

In another technology, metal particles, which are mainly gold or silver or gold-silver alloy particles, are filled in the accommodating hole, so the accommodating hole may be small, and therefore the density of the electrical connector is large, and the volume is also small. However, the metal particles are in contact with each other in a point-to-point manner, and the contact area is small, so that the whole impedance of the metal particles in the accommodating hole is large, which affects normal current transmission.

Therefore, a heretofore unaddressed need exists in the art to address the aforementioned deficiencies and inadequacies.

SUMMARY OF THE INVENTION

In one aspect, the present invention is directed to an electrical connector whose impedance is small, and which improve stability of electrical connection and signal transmission between a chip module and the electrical connector.

In one embodiment, an electrical connector is used for electrically connecting a chip module to a circuit board. The electrical connector includes an insulating body, multiple conducting bodies, and multiple pieces of low melting point metal. The insulating body has multiple accommodating spaces, and each of the accommodating spaces runs through upper and lower surfaces of the insulating body. Each of the multiple conducting bodies is correspondingly accommodated in one of the accommodating spaces. Two ends of the conducting body are exposed on the upper and lower surfaces of the insulating body. The low melting point metal is gallium or gallium alloy. Each piece of the low melting point metal is correspondingly arranged at at least one end of one of the conducting bodies. The low melting point metal protrudes from the insulating body, and is electrically connected to the chip module.

In one embodiment, fillers are disposed in the low melting point metal.

In one embodiment, an outer surface of the filler is disposed with a material compatible with the low melting point metal.

In one embodiment, the material is indium or tin or zinc.

In one embodiment, the filler is an elastomer.

In one embodiment, the elastomer is an elastic sheet or sponge or elastic silica gel.

In one embodiment, the filler is a particle-shaped object.

In one embodiment, the particle-shaped object is a metal particle or a non-metal particle.

In one embodiment, the particle-shaped object is magnetic.

In one embodiment, the conducting body is a copper sheet.

In one embodiment, a surface of the conducting body is covered with a protecting layer.

In one embodiment, the protecting layer is made of nickel.

In one embodiment, the conducting body is covered with a fusing layer.

In one embodiment, the fusing layer is made of indium or tin or zinc.

In one embodiment, the conducting body is electrically connected to the fusing layer through the protecting layer.

In one embodiment, at least one positioning hole is correspondingly arranged on the insulating body and the circuit board. A positioning column is disposed in the positioning hole. When the insulating body is installed at the circuit board, the positioning column guides the insulating body to be correctly positioned at the circuit board.

In one embodiment, the lower surface of the insulating body is disposed with a support portion.

In one embodiment, the upper surface of the insulating body is disposed with two protruding portions, and the protruding portions are respectively a limiting block and a support block.

In one embodiment, the height of the support block is less than the height of the top of the low melting point metal.

In one embodiment, an isolation portion is arranged between the insulating body and the chip module.

In one embodiment, the isolation portion is arranged between two neighboring pieces of the low melting point metal.

In one embodiment, the isolation portion is made of a hydrophobic material or an elastic high-molecular material or an insulating film.

In one embodiment, a part of the conducting body protrudes from the insulating body, and the insulating body is coated with green paint.

In one embodiment, the conducting body is electrically connected to the circuit board through welding.

In one embodiment, the two ends of the conducting body are both provided with the low melting point metal (liquid metal at room temperature).

In one embodiment, the conducting body is electrically connected to the circuit board through the low melting point metal (liquid metal at room temperature).

As compared with the related art, certain embodiments of the present invention have the following beneficial advantages.

The low melting point metal is arranged on the conducting body, and the conducting body is electrically connected to the chip module. The impedance of the low melting point metal is small, so the impedance of the electrical connector is small, so as to ensure normal current transmission, and provide a clear and stable communication effect. Also, an isolation portion is arranged between the insulating body and the chip module, and may stop two neighboring pieces of low melting point metal, and reduce occurrence of the short-circuited phenomenon.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
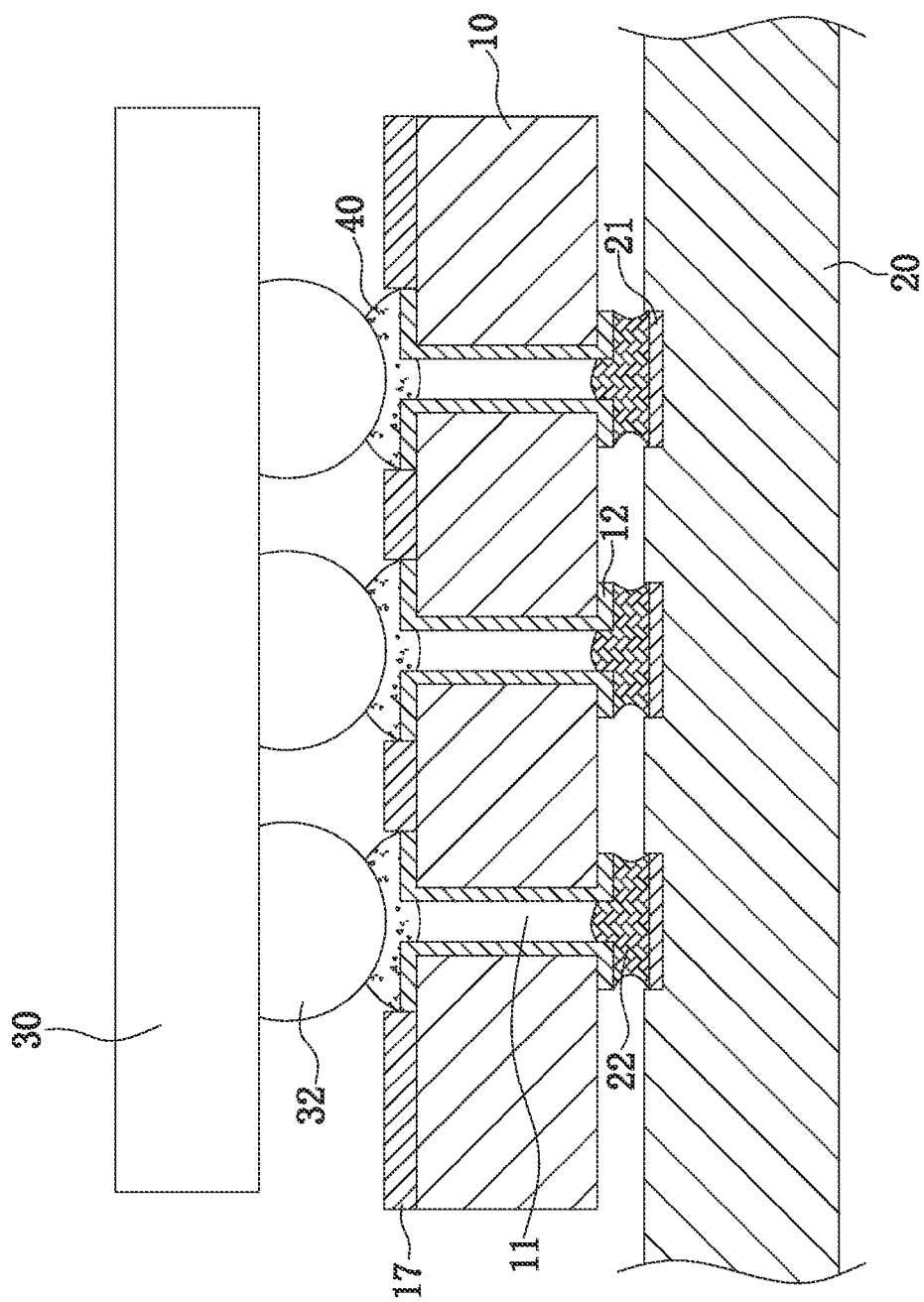
FIG. 1 is a schematic sectional view where an electrical connector contacts a chip module and a circuit board according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

As shown in FIG. 1, an electrical connector according to one embodiment of the present invention is used for electrically connecting a chip module 30 with a circuit board 20. The bottom of the chip module 30 is provided with multiple second contact pads 31. The second contact pad 31 may be a tin ball 32. A surface of the circuit board 20 is provided with multiple first contact pads 21. The chip module 30 is electrically connected to the electrical connector by press fitting.

Figure 2:
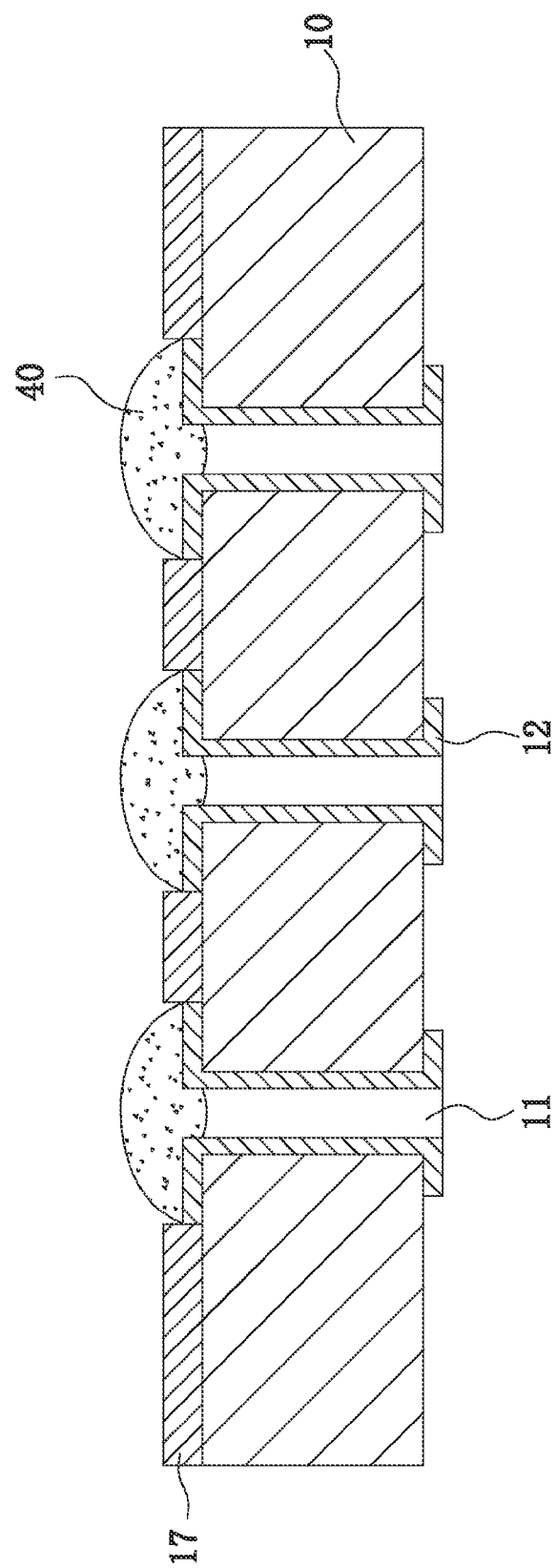
FIG. 2 is a schematic sectional view of the electrical connector according to the present invention.

As shown in FIG. 1 and FIG. 2, the electrical connector has an insulating body 10, multiple conducting bodies 12, and multiple pieces of low melting point metal 40. The insulating body 10 has multiple accommodating spaces 11. Each of the accommodating spaces 11 runs through upper and lower surfaces of the insulating body 10. The upper surface of the insulating body 10 is coated with a layer of green paint 17. Each of the multiple conducting bodies 12 is correspondingly accommodated in each of the accommodating spaces 11. Two ends of the conducting body 12 are exposed and attached to the upper and lower surfaces of the insulating body 10. Each of the multiple pieces of low melting point metal 40 is respectively disposed at at least one end of the conducting body 12. Preferably, the low melting point metal 40 is disposed at an upper end of the conducting body 12, and electrically connected to the tin ball 32. The low melting point metal 40 contacts the tin ball 32, so as to increase the number of transmission paths during signal transmission.

The low melting point metal 40 is selected from any one of gallium metal, indium gallium alloy, indium tin alloy, gallium tin alloy and indium gallium tin alloy. The melting point of gallium is about 29.76° C., so gallium metal may be directly used as the low melting point metal 40. The melting point of indium is about 156.61° C., and the melting point of tin is about 231.93° C., but the melting point of binary or ternary alloy of indium, gallium, and tin may be greatly reduced. The melting points of the foregoing alloys differ according to different proportions. For example, when the proportion of indium-gallium is 24.5:75.5, the melting point of binary alloy of indium and gallium is 15.7° C. When the proportion of indium-gallium-tin is 20.5:66.5:13.0, the melting point of ternary alloy of indium gallium and tin is 10.7° C. Therefore, the low melting point metal 40 may further be any one of indium-gallium, indium-tin, gallium-tin, and indium-gallium-tin. A user may prepare alloy by use of gallium metal, or according to a proportion of indium metal, gallium metal, and tin metal, so that at a room temperature, the gallium metal, the indium gallium alloy, the indium tin alloy, the gallium tin alloy and the indium gallium tin alloy are in a liquid form. Therefore, the contact area between the metal is large, the impedance is small, and during current transmission, no energy is consumed due to the low impedance, thereby ensuring the stability of the current transmission, and good effect of electrical connection.

As shown in FIG. 3 to FIG. 8, fillers may be disposed in the low melting point metal 40. The outer surface of the filler is provided with a material (not shown in the drawing) compatible with the low melting point metal 40, and the material may be indium or tin or zinc. The filler may be a particle-shaped object 41 or an elastomer. The particle-shaped object 41 may be a metal particle, such as, a copper ball or a silver ball, or may also be a non-metal particle, such as a plastic ball or a silica gel ball, and the particle-shaped object 41 may further be magnetic. The elastomer may be sponge 42 or an elastic sheet 43.

Figure 3:
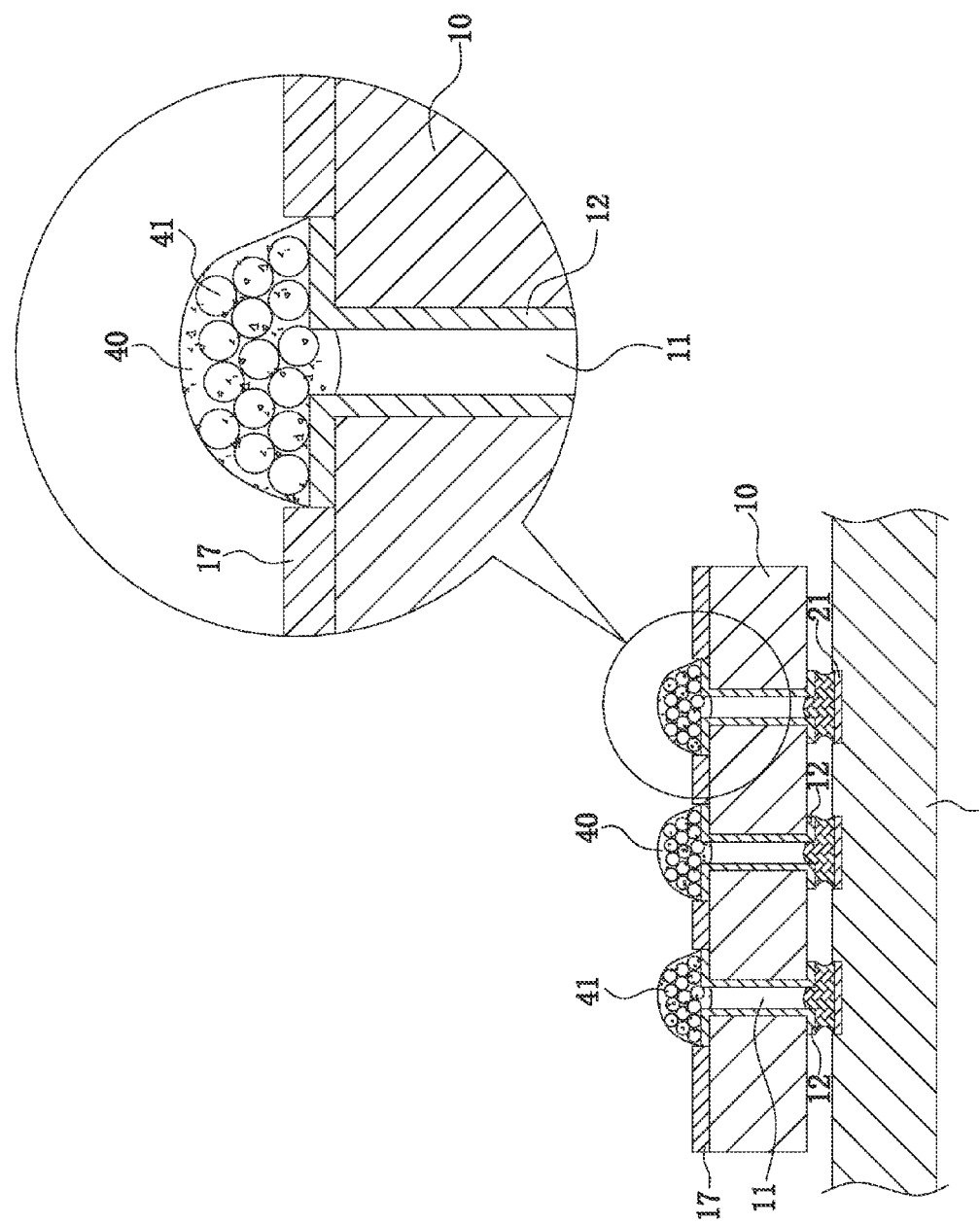
FIG. 3 is a schematic sectional view and a local enlarged view where a particle-shaped object is arranged in low melting point metal of the electrical connector according to one embodiment of the present invention.
Figure 4:
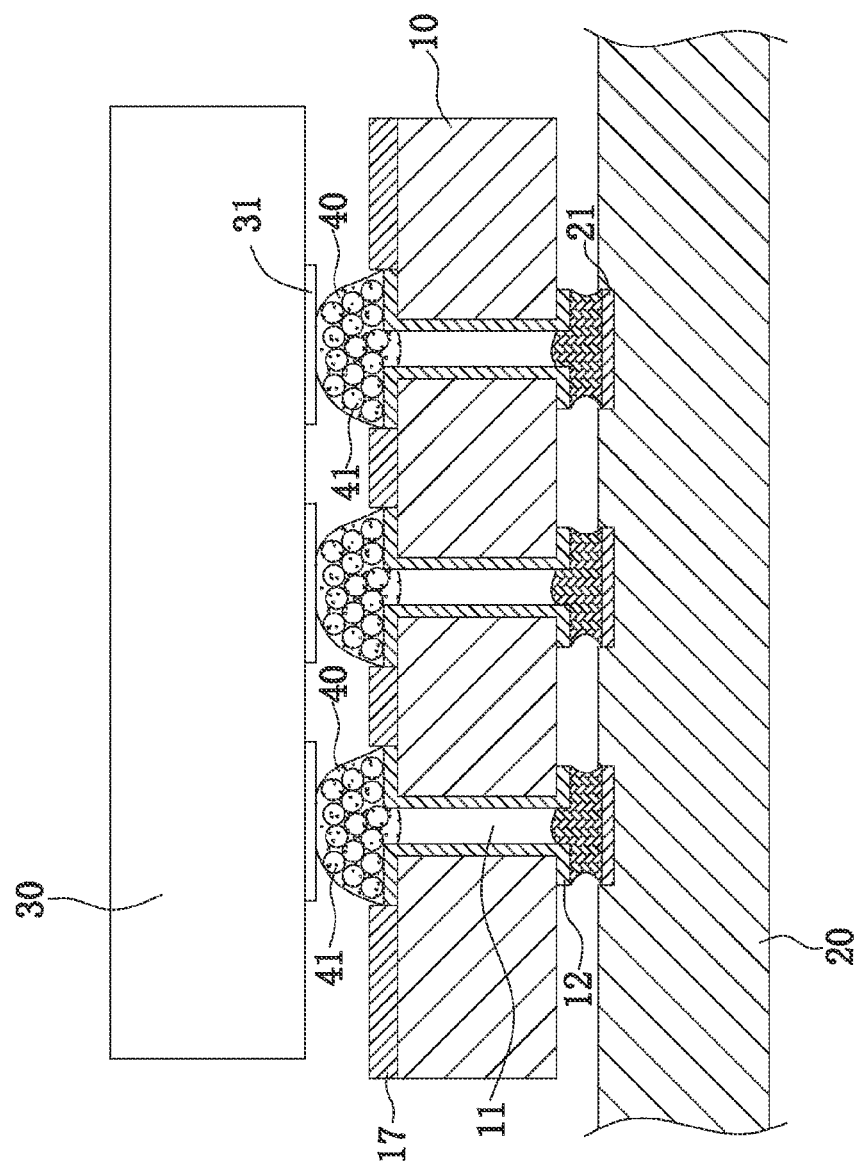
FIG. 4 is a schematic sectional view where the electrical connector contacts the chip module and the circuit board in FIG. 3.

As shown in FIG. 3 and FIG. 4, by arranging the particle-shaped object 41 in the low melting point metal 40, in this embodiment, the particle-shaped object 41 is a copper ball or silver ball, and by increasing the number of the particle-shaped objects 41, the following advantages are provided: (1), the fluidity of the low melting point metal 40 may be reduced, and the short-circuited phenomenon may be prevented from occurring; (2), the height of the low melting point metal 40 may be increased, and moreover, the risk of power failure because of non-contact of an externally connected electronic element (such as a CPU or chip) or vibration impact may further be reduced; (3), the quantity of the low melting point metal 40 used may be reduced, and the manufacturing cost may be reduced; (4), if the number of silica gel balls or other elastic particles is increased, the contact portion may be elastic, and moreover, the risk of power failure because of non-contact of an externally connected electronic element (such as a CPU or chip) or vibration impact may further be reduced.

Figure 5:
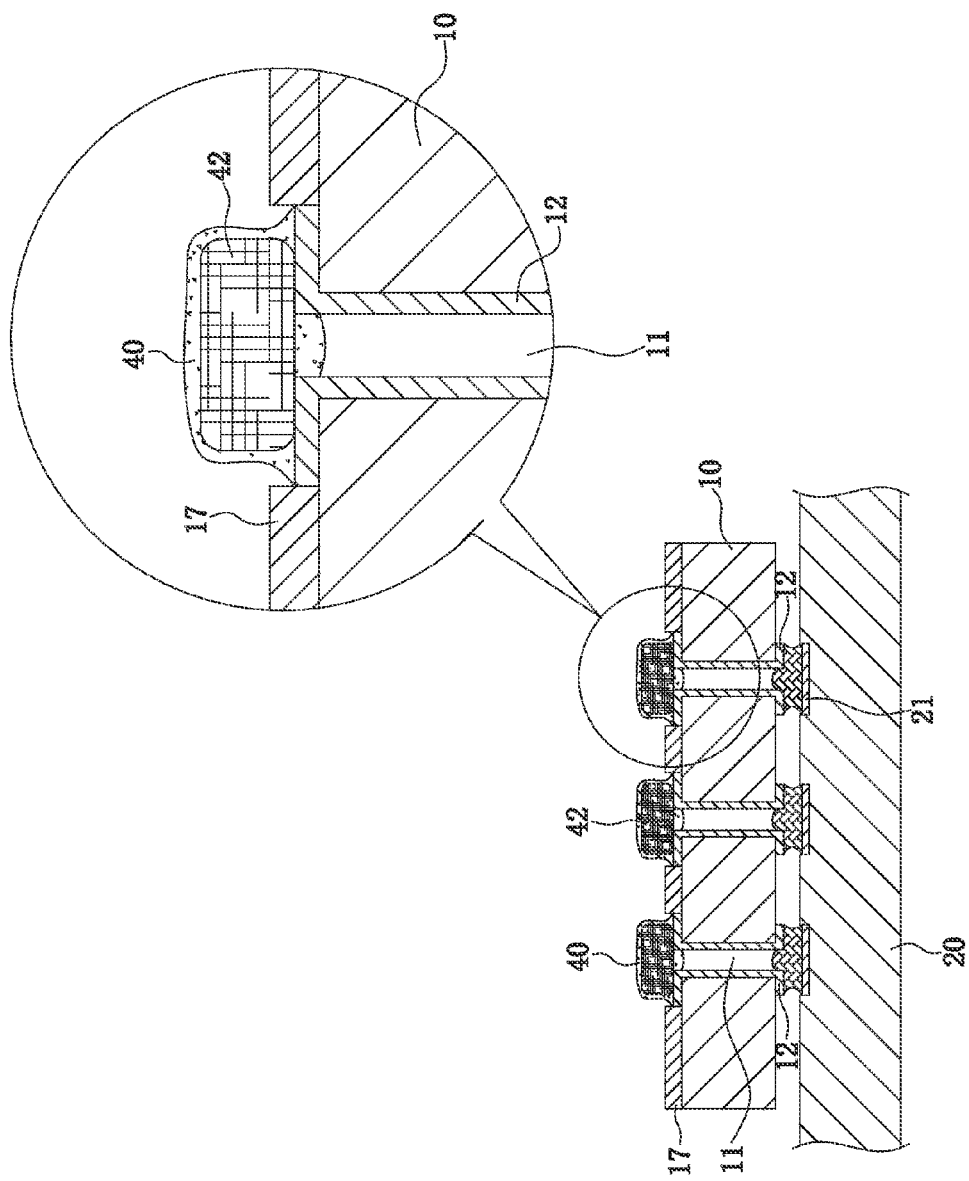
FIG. 5 is a schematic sectional view and a local enlarged view where sponge is arranged in the low melting point metal of the electrical connector according to one embodiment of the present invention.
Figure 6:
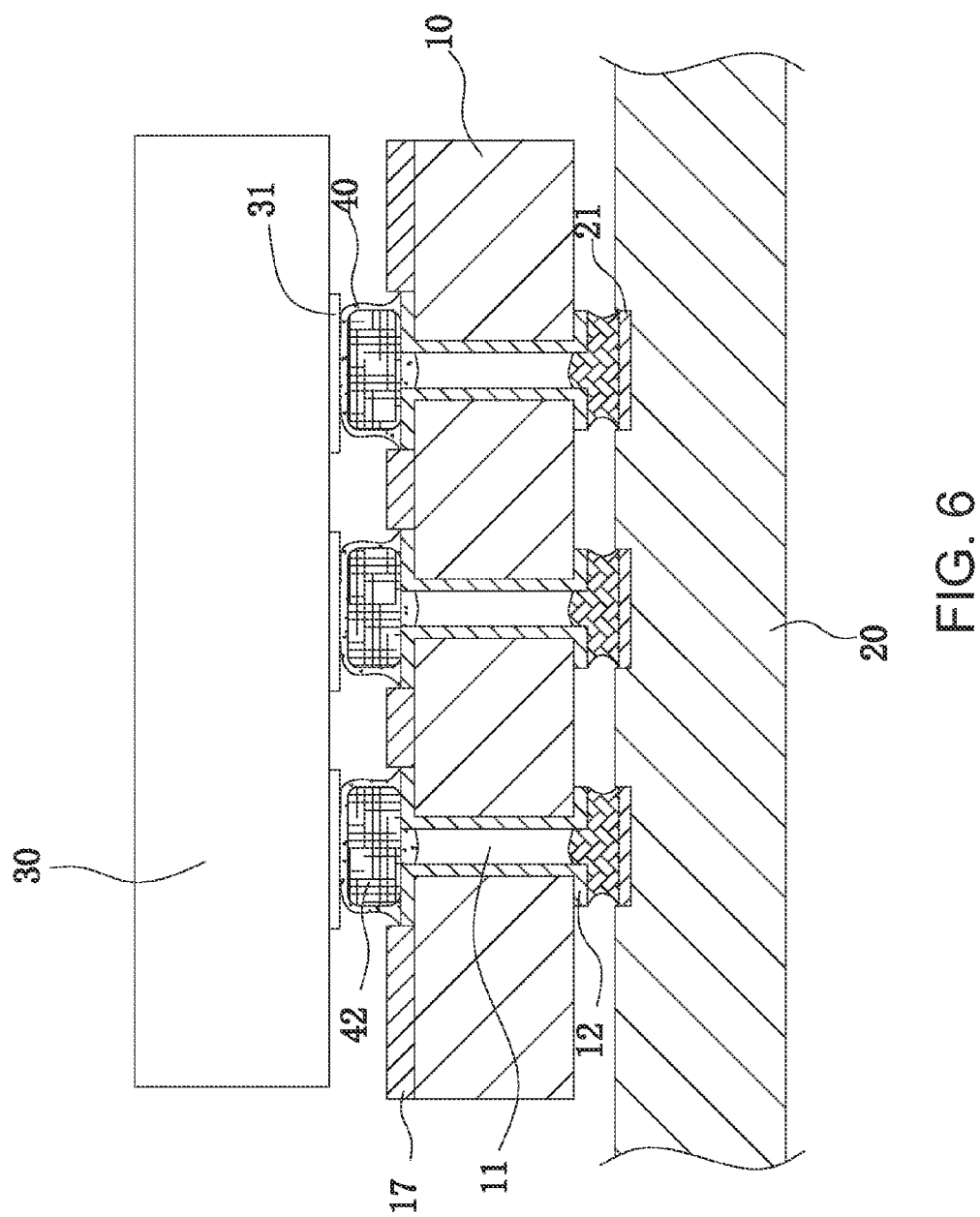
FIG. 6 is a schematic sectional view where the electrical connector contacts the chip module and the circuit board in FIG. 5.

As shown in FIG. 5 and FIG. 6, by arranging the sponge 42 in the low melting point metal 40, the following advantages are provided: (1), the sponge 42 has an adsorbing function, so physical phenomena such as outward expansion and flowing of the low melting point metal 40 may be reduced, and the short-circuited phenomenon may be prevented from occurring; (2), the height of the low melting point metal 40 may be increased, and moreover, the risk of power failure because of non-contact of an externally connected electronic element (such as a CPU or chip) or vibration impact may further be reduced; (3), the quantity of the low melting point metal 40 used may be reduced, and the manufacturing cost may be reduced; (4), the sponge 42 is elastic, so the contact portion may be elastic, and moreover, the risk of power failure because of non-contact of an externally connected electronic element (such as a CPU or chip) or vibration impact may further be reduced.

Figure 7:
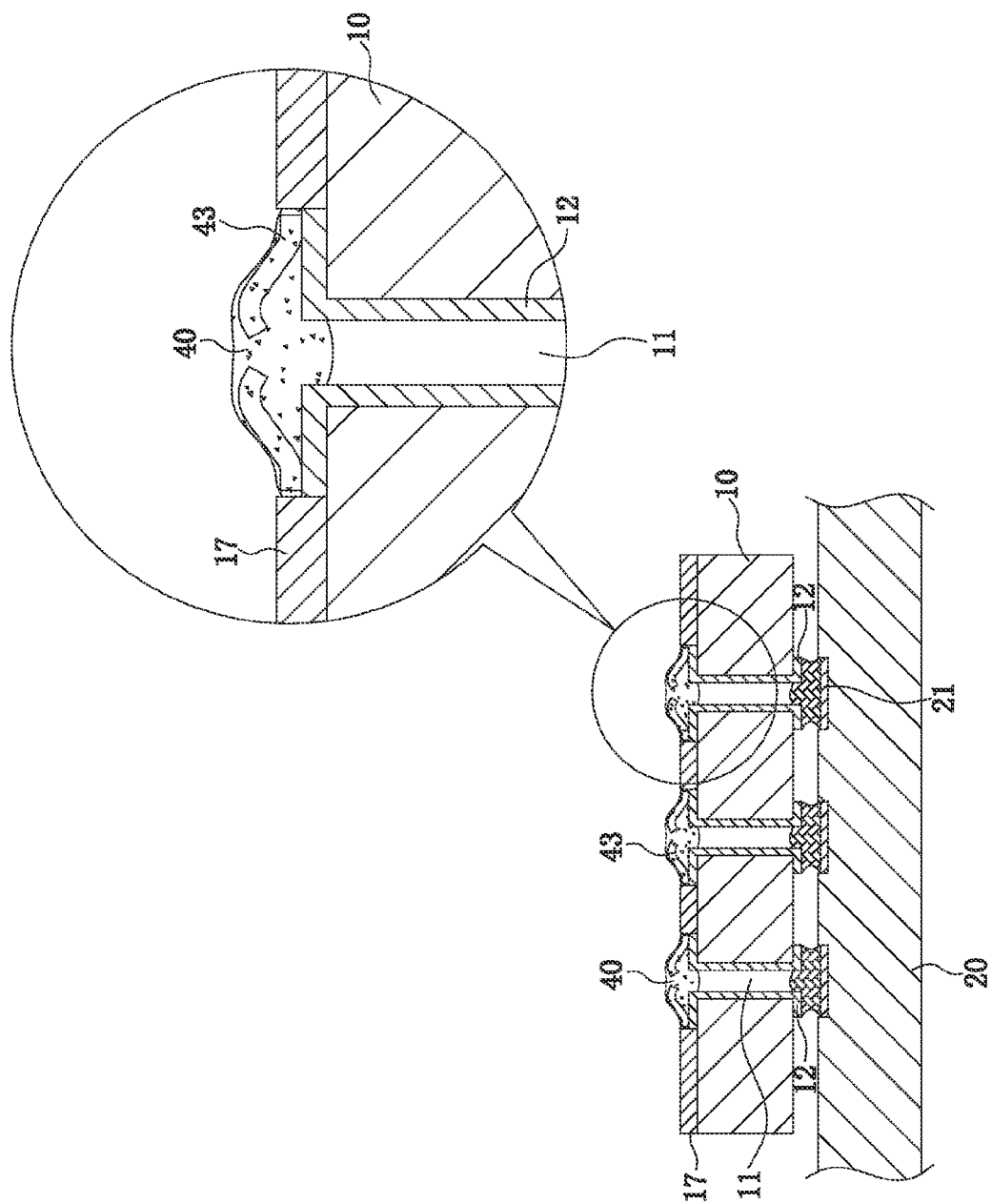
FIG. 7 is a schematic sectional view and a local enlarged view where an elastic sheet is arranged in the low melting point metal of the electrical connector according to one embodiment of the present invention.
Figure 8:
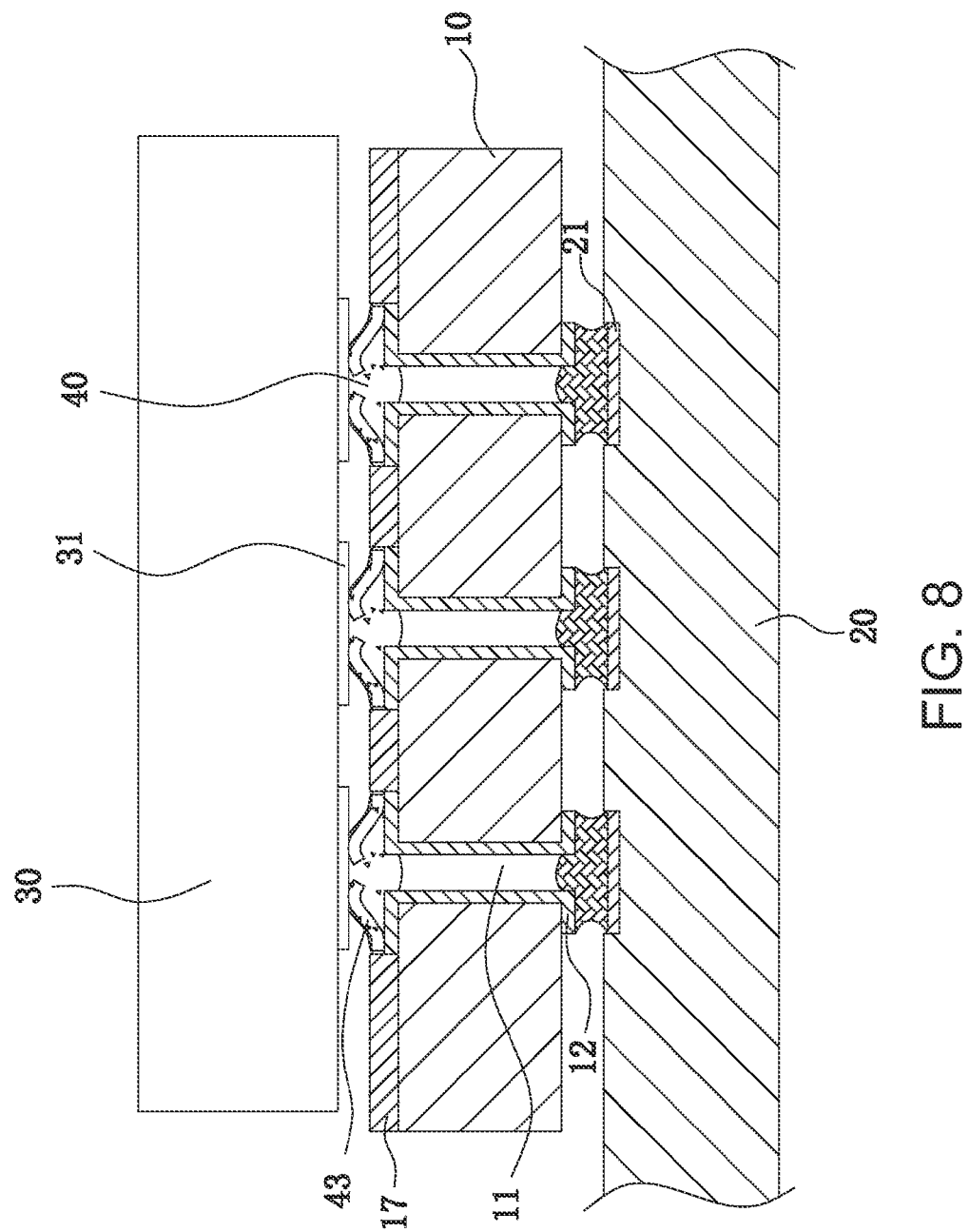
FIG. 8 is a schematic sectional view where the electrical connector contacts the chip module and the circuit board in FIG. 7.

As shown in FIG. 7 and FIG. 8, by arranging the elastic sheet 43 in the low melting point metal 40, the following advantages are provided: (1), the fluidity of the low melting point metal 40 may be reduced, and the short-circuited phenomenon may be prevented from occurring; (2), the height of the low melting point metal 40 may be increased, and moreover, the risk of power failure because of non-contact of an externally connected electronic element (such as a CPU or chip) or vibration impact may further be reduced; (3), if the number of the elastomers is increased, the contact portion may be elastic, and moreover, the risk of power failure because of non-contact of an externally connected electronic element (such as a CPU or chip) or vibration impact may further be reduced.

Figure 9:
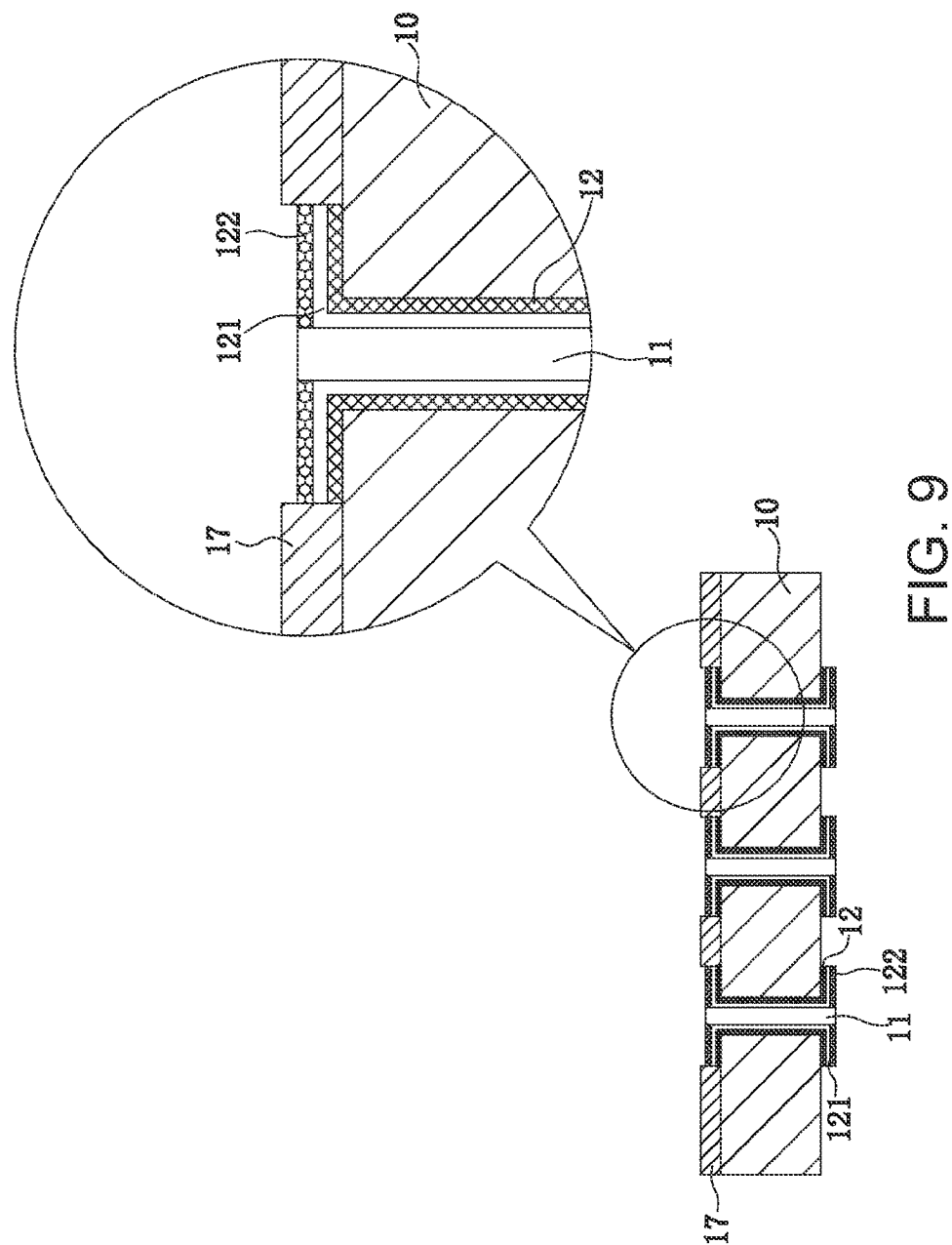
FIG. 9 is a schematic sectional view and a local enlarged view of another implementation manner of a conducting body in the electrical connector according to one embodiment of the present invention.
Figure 10:
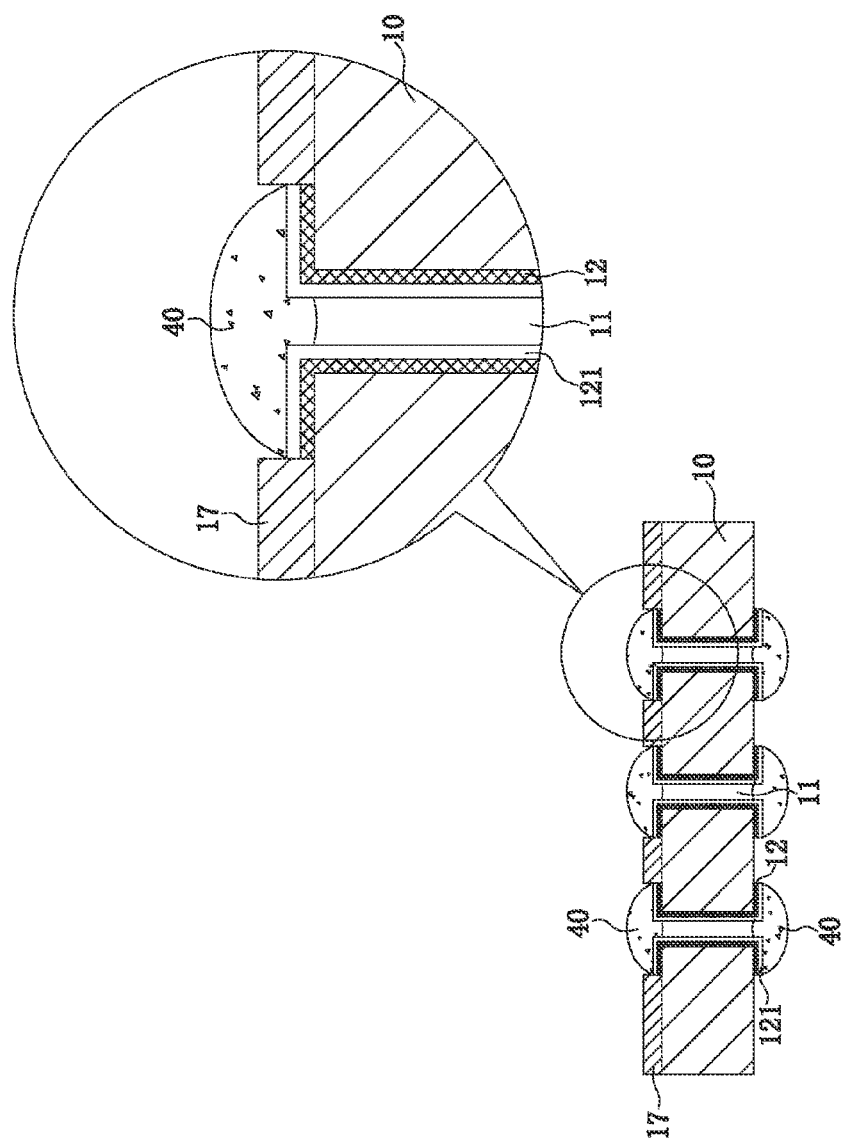
FIG. 10 is a schematic sectional view and a local enlarged view where the electrical connector is provided with the low melting point metal in FIG. 9.

As shown in FIG. 9 and FIG. 10, a surface of the conducting body 12 is covered with a protecting layer 121. In this embodiment, preferably the protecting layer is made of nickel. A part of the protecting layer 121 protruding from the upper and lower surfaces of the insulating body 10 is provided with a fusion layer 122. The fusion layer 122 may be made of indium or tin or zinc. In this embodiment, the fusion layer 122 is preferably made of tin. The tin may form alloy with the low melting point metal 40, and moreover, the fluidity of the low melting point metal 40 may be reduced by increasing the content of the tin, so the short-circuited phenomenon may further be prevented from occurring.

Figure 11:
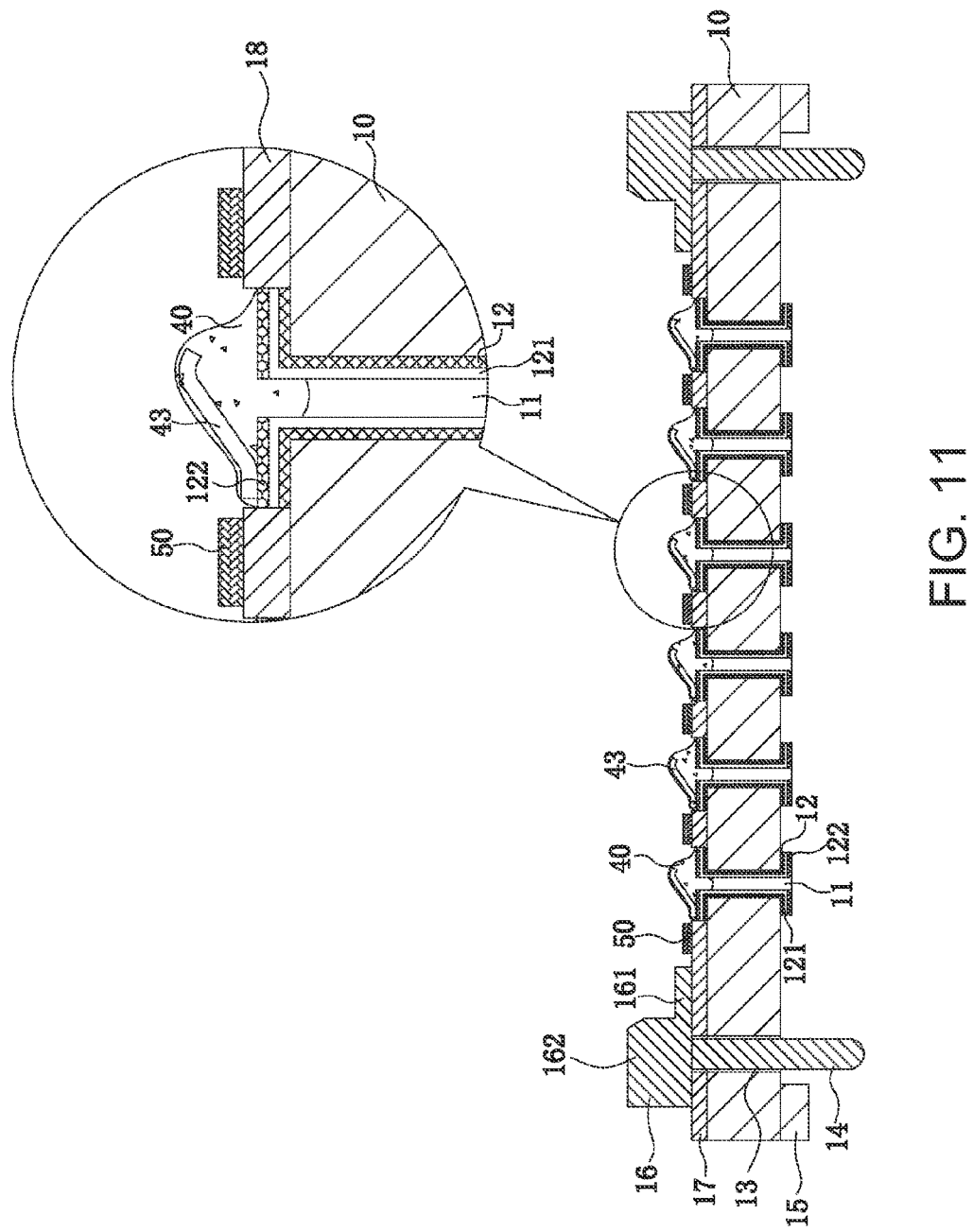
FIG. 11 is a schematic sectional view of assembly of the electrical connector according to one embodiment of the present invention.
Figure 12:
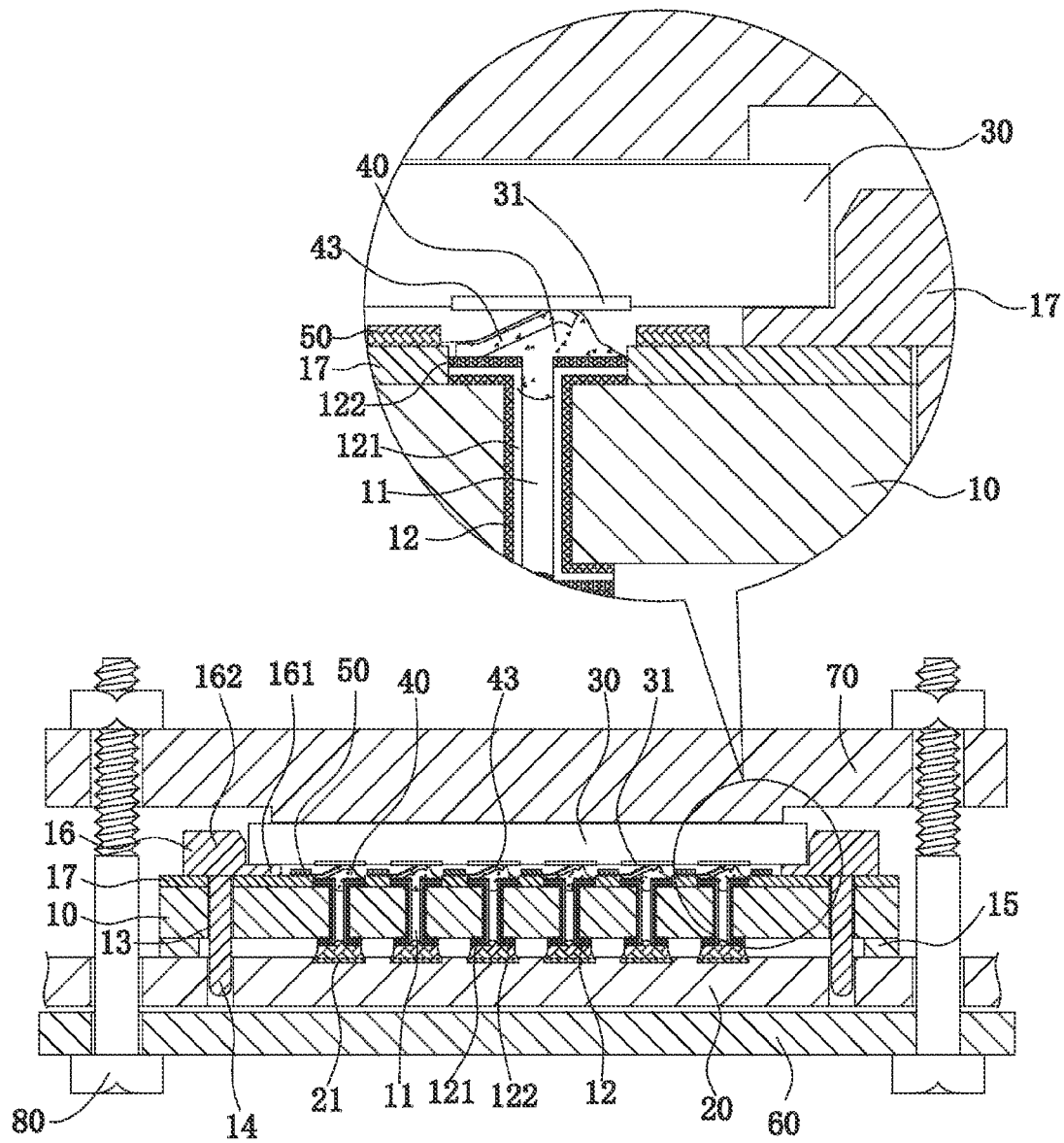
FIG. 12 is a schematic sectional view where the electrical connector is wholly assembled with the chip module and the circuit board in FIG. 11.

As shown in FIG. 11 and FIG. 12, the lower surface of the insulating body 10 is disposed with a support portion 15, the upper surface of the insulating body 10 is disposed with two protruding portions 16. The two protruding portions 16 are respectively a support block 161 and a limiting portion 162. The height of the limiting block 162 is greater than the height of the support block 161. The support block 161 is used for supporting the chip module 30, the limiting portion 162 is used for guiding the chip module 30 to press against the insulating body 10, and ensuring electrical connection between the tin ball 32 and the low melting point metal 40, and the height of the support block 161 is less than the height of the top of the low melting point metal 40. An isolation portion 50 is arranged between the insulating body 10 and the chip module 30. The isolation portion 50 is disposed on the green paint 17, and the isolation portion 50 is made of a hydrophobic material or an elastic high-molecular material or an insulating film. The isolation portion 50 may stop two neighboring pieces of the low melting point metal, so as to reduce occurrence of the short-circuited phenomenon.

The electrical connector further includes a positioning apparatus. At least one positioning hole 13 is correspondingly arranged on the insulating body 10 and the circuit board 20. A positioning column 14 is disposed in the positioning hole 13. When the insulating body 10 is installed at the circuit board 20, the positioning column 14 guides the insulating body 10 to be correctly positioned at the circuit board 20. A back board 60 is arranged below the circuit board 20. A pressing plate 70 is arranged above the chip module 30. The pressing plate 70 is fixed on the back board 60 through a fastening apparatus 80, and the fastening apparatus 80 and the pressing plate 70 provide the strength for pressing the chip module 30 downward.

Figure 13:
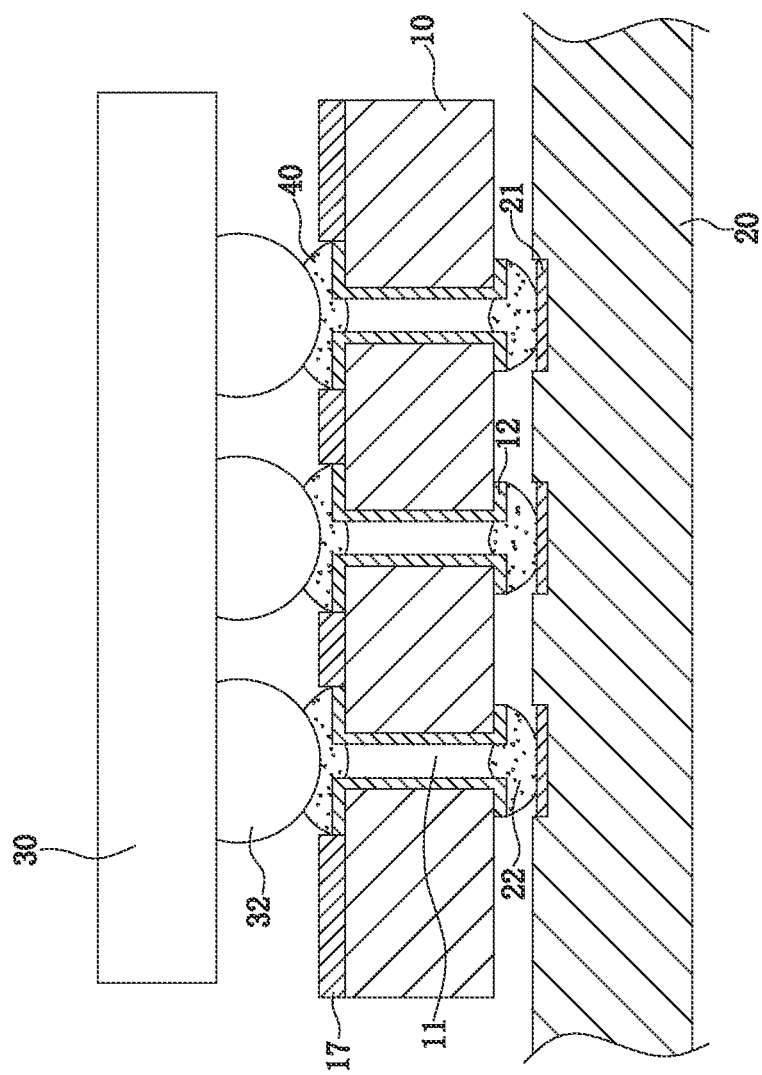
FIG. 13 is a schematic sectional view of another implementation manner of the electrical connector according to one embodiment of the present invention.

As shown in FIG. 13, the structure of another implementation manner of the present invention is approximately the same as the structure of the first embodiment, and the difference lies in that, two ends of the conducting body 12 are both provided with the low melting point metal 40. The chip module 30 is electrically connected to the insulating body 10 through the low melting point metal 40 at the upper end of the conducting body 12, and the circuit board 20 is electrically connected to the insulating body 10 through the low melting point metal 40 at the lower end of the conducting body 12.

In summary, the electrical connector according to certain embodiments of the present invention, among other things, has the following beneficial advantages.

(1) Electrical transmission is performed through the low melting point metal 40, so that the contact area of the conducting body in the accommodating space 11 is large, the impedance is small, and during current transmission, no energy is consumed due to the impedance, thereby ensuring stability of the current transmission, and good electrical connection effect.

(2) The isolation portion 50 is arranged between the insulating body 10 and the chip module 30, and may stop two neighboring pieces of the low melting point metal 40, so as to reduce occurrence of the short-circuited phenomenon.

(3) By arranging a filler in the low melting point metal 40, the fluidity of the low melting point metal 40 may be reduced, and the short-circuited phenomenon may be prevented from occurring. The height of the low melting point metal may further be increased, and the risk of power failure because of non-contact of an externally connected electronic element (such as a CPU or chip) or vibration impact may further be reduced;

(4) A filler is arranged in the low melting point metal 40, and the quantity of the low melting point metal 40 used may be reduced, so as to reduce the manufacturing cost.

(5) Some elastic fillers are arranged in the low melting point metal 40, so the contact portion may be elastic, and the risk of power failure because of non-contact of an externally connected electronic element (such as a CPU or chip) or vibration impact may further be reduced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module to a circuit board, comprising:
    an insulating body having multiple accommodating spaces, wherein each of the accommodating spaces runs through upper and lower surfaces of the insulating body;
    multiple conducting bodies, respectively received in the accommodating spaces, wherein two ends of each conducting body are exposed on the upper and lower surfaces of the insulating body; and
    multiple pieces of low melting point metal, wherein the low melting point metal is gallium or gallium alloy, and each piece of the low melting point metal is correspondingly arranged at at least one end of one of the conducting bodies,
    wherein the low melting point metal protrudes from the insulating body, and is electrically connected to the chip module.

2. The electrical connector according to claim 1, further comprising fillers disposed in the low melting point metal.

3. The electrical connector according to claim 2, wherein an outer surface of the filler is provided with a material compatible with the low melting point metal.

4. The electrical connector according to claim 3, wherein the material is indium, tin, or zinc.

5. The electrical connector according to claim 2, wherein the filler is an elastomer.

6. The electrical connector according to claim 5, wherein the elastomer is an elastic sheet, a sponge, or an elastic silica gel.

7. The electrical connector according to claim 2, wherein the filler is a particle-shaped object.

8. The electrical connector according to claim 7, wherein the particle-shaped object is a metal particle or a non-metal particle.

9. The electrical connector according to claim 7, wherein the particle-shaped object is magnetic.

10. The electrical connector according to claim 1, wherein the conducting body is a copper sheet.

11. The electrical connector according to claim 1, further comprising a protecting layer covered on a surface of the conducting body.

12. The electrical connector according to claim 11, wherein the protecting layer is made of nickel.

13. The electrical connector according to claim 1, further comprising a fusing layer covered on the conducting body.

14. The electrical connector according to claim 13, wherein the fusing layer is made of indium, tin, or zinc.

15. The electrical connector according to claim 1, further comprising a protecting layer covered on a surface of the conducting body, and a fusing layer disposed on the protecting layer, wherein the conducting body is electrically connected to the fusing layer through the protecting layer.

16. The electrical connector according to claim 1, further comprising at least one positioning hole correspondingly disposed on the insulating body and the circuit board, and a positioning column disposed in the positioning hole, wherein when the insulating body is installed at the circuit board, the positioning column guides the insulating body to be correctly positioned at the circuit board.

17. The electrical connector according to claim 1, further comprising a support portion disposed at the lower surface of the insulating body.

18. The electrical connector according to claim 1, further comprising two protruding portions disposed on the upper surface of the insulating body, wherein the protruding portions are respectively a limiting block and a support block.

19. The electrical connector according to claim 18, wherein the height of the support block is less than the height of the top of the low melting point metal.

20. The electrical connector according to claim 1, further comprising an isolation portion disposed between the insulating body and the chip module.

21. The electrical connector according to claim 20, wherein the isolation portion is positioned between two neighboring pieces of the low melting point metal.

22. The electrical connector according to claim 20, wherein the isolation portion is made of a hydrophobic material, an elastic high-molecular material, or an insulating film.

23. The electrical connector according to claim 1, wherein a part of the conducting body protrudes from the insulating body, and the insulating body is coated with green paint.

24. The electrical connector according to claim 1, wherein the conducting body is electrically connected to the circuit board through welding.

25. The electrical connector according to claim 1, wherein the two ends of the conducting body are both provided with the low melting point metal.

26. The electrical connector according to claim 1, wherein the conducting body is electrically connected to the circuit board through the low melting point metal.

* * * * *